United States Patent
Dunsmore et al.

(10) Patent No.: US 7,500,161 B2
(45) Date of Patent: Mar. 3, 2009

(54) CORRECTING TEST SYSTEM CALIBRATION AND TRANSFORMING DEVICE MEASUREMENTS WHEN USING MULTIPLE TEST FIXTURES

(75) Inventors: Joel P Dunsmore, Sebastopol, CA (US); Loren C Betts, Rohnert Park, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 207 days.

(21) Appl. No.: 10/537,031

(22) PCT Filed: Jun. 1, 2004

(86) PCT No.: PCT/US2004/017250

§ 371 (c)(1),
(2), (4) Date: May 31, 2005

(87) PCT Pub. No.: WO2004/111768

PCT Pub. Date: Dec. 23, 2004

(65) Prior Publication Data

US 2006/0155498 A1 Jul. 13, 2006

Related U.S. Application Data

(60) Provisional application No. 60/478,034, filed on Jun. 11, 2003.

(51) Int. Cl.
*G01R 31/28* (2006.01)
(52) U.S. Cl. .................. 714/724; 714/703; 714/18; 714/712; 714/718
(58) Field of Classification Search ............... None See application file for complete search history.

(56) References Cited

U.S. PATENT DOCUMENTS

| | | | | |
|---|---|---|---|---|
| 4,603,292 | A * | 7/1986 | Russell | 324/76.39 |
| 4,749,943 | A * | 6/1988 | Black | 324/754 |
| 5,381,417 | A | 1/1995 | Loopik et al. | |
| 5,784,299 | A * | 7/1998 | Evers et al. | 702/85 |
| 6,147,501 | A * | 11/2000 | Chodora | 324/601 |
| 6,300,775 | B1 * | 10/2001 | Peach et al. | 324/601 |
| 6,541,993 | B2 * | 4/2003 | Laureanti | 324/765 |

(Continued)

OTHER PUBLICATIONS

AN1287-3, Applying Error Correction to Network Analyzer Measurements, Agilent Technologies, Inc., 5965-7709E, Copyright 2002, Printed in USA Mar. 27, 2002, pp. 1-16.

(Continued)

*Primary Examiner*—John P Trimmings
*Assistant Examiner*—Guerrier Merant

(57) ABSTRACT

A test system and methods using the test system correlate measurements of a device under test (DUT) regardless of which test fixture is used for in-fixture testing of the DUT. The test system includes test equipment, a test fixture that interfaces the DUT to the test equipment, a computer and a computer program executed by the computer. The computer program includes instructions that implement determining a port-specific difference array for test fixtures used with the test system. The difference array describes a difference between the test fixtures at a corresponding test port thereof. The method includes determining the difference array, measuring a performance of the DUT in a second test fixture, and applying the difference array such that the measured performance approximates a hypothetical DUT performance for the DUT as if mounted in a first test fixture.

31 Claims, 7 Drawing Sheets

U.S. PATENT DOCUMENTS

| | | | | |
|---|---|---|---|---|
| 6,643,597 B1* | 11/2003 | Dunsmore | | 702/104 |
| 6,697,749 B2 | 2/2004 | Kamitani | | |
| 6,836,743 B1* | 12/2004 | Blackham et al. | | 702/107 |
| 6,960,920 B2* | 11/2005 | Kamitani | | 324/601 |
| 7,109,728 B2* | 9/2006 | Crook et al. | | 324/690 |
| 7,165,003 B2* | 1/2007 | Mok | | 702/118 |
| 2002/0118034 A1* | 8/2002 | Laureanti | | 324/765 |
| 2002/0199141 A1* | 12/2002 | Lemlein et al. | | 714/724 |
| 2003/0083839 A1* | 5/2003 | Boswell et al. | | 702/117 |
| 2003/0208717 A1* | 11/2003 | Klotchkov et al. | | 714/814 |
| 2004/0027138 A1* | 2/2004 | Pickerd et al. | | 324/646 |
| 2004/0125675 A1* | 7/2004 | Kim et al. | | 365/201 |
| 2004/0181731 A1* | 9/2004 | Rajsuman et al. | | 714/747 |
| 2004/0183542 A1* | 9/2004 | Kamitani | | 324/500 |
| 2005/0001611 A1* | 1/2005 | Conti et al. | | 324/158.1 |
| 2005/0171716 A1* | 8/2005 | Clarke et al. | | 702/117 |
| 2006/0064269 A1* | 3/2006 | Mok | | 702/118 |
| 2006/0155498 A1* | 7/2006 | Dunsmore et al. | | 702/107 |
| 2006/0279295 A1* | 12/2006 | Crook et al. | | 324/690 |

OTHER PUBLICATIONS

AN 8510-5B, Specifying Calibration Standards for the Agilent 8510 Network Analyzer, Agilent Technologies, Inc., 5956-4352, Copyright 2001, 2004, Printed in USA Apr. 23, 2004, pp. 1-32.

AN1287-9, In-Fixture Measurement using Vector Network Analyzers, Agilent Technologies, Inc., 5968-5329E, Copyright 1999, 2000, Printed in USA Aug. 2000, pp. 1-32.

International Search Report dated Jun. 22, 2007.

* cited by examiner a patent application is a regular application of and
CORRECTING TEST SYSTEM CALIBRATION AND TRANSFORMING DEVICE MEASUREMENTS WHEN USING MULTIPLE TEST FIXTURES

CROSS-REFERENCE TO RELATED APPLICATIONS

This patent application is a regular application of and claims priority from Provisional Application Ser. No. 60/478,034, filed Jun. 11, 2003, incorporated herein by reference.

BACKGROUND

Test systems are critical to the manufacture and maintenance of modern electronic devices and systems including, but not limited to microwave devices, cell phones, telecommunication and computer networks, and television transmission equipment. Some examples of such test equipment are scalar network analyzers, vector network analyzers, spectrum analyzers, and power meters. Most of these test systems may be calibrated to mitigate or remove the effects of any test system imperfections from a measurement of a device under test (DUT). Such calibration uses the test system to measure a calibration standard. A calibration standard is simply a DUT having known performance characteristics. The test system is calibrated using differences between the known performance characteristics of the calibration standard and measured results obtained from measuring the calibration standard.

In many situations, a test fixture is used to facilitate testing a particular DUT by the test system. The test fixture essentially interfaces the test system to the DUT. In some situations where a test fixture is employed, calibrating the test system to include effects of the test fixture is either difficult or impractical. In other situations, the DUT simply may be specified in terms of performance in a given test fixture (e.g., a reference test fixture). In either case, the test system may be calibrated at an interface between the test fixture and the DUT, such that error-corrected measurements of the DUT in the test fixture include both an actual performance of the DUT and a performance of a reference test fixture. Subsequent copies of the DUT may be compared and evaluated relative to an original DUT by testing each copy in the reference test fixture.

Unfortunately, the reference test fixture may not be well suited for use in production testing during a mass production of the DUT. Instead, a production test fixture, adapted for high-speed production testing, for example, may be employed. Since the production test fixture differs physically from the reference test fixture, the production test fixture typically has different performance characteristics from those of the reference test fixture. As such, calibrating the test system at inputs of the production test fixture will generally yield different measured results for a given DUT than would be obtained if the DUT were to be tested in the reference test fixture. The differences in measured results between the reference fixture and the production fixture can lead to incorrect production test results, such as failing DUTs that are actually operating properly or passing DUTs that are not operating within acceptable tolerance limits, simply because the text fixture differences obscure a true performance of the DUTs.

Accordingly, it would be advantageous have a way to correct a calibration of a test system for measuring DUTs in different test fixtures and/or to correlate measurements of the DUTs taken with the test system in different test fixtures. Such a correction and/or transformation would solve a long-standing need in the calibrated test systems using multiple test fixtures.

BRIEF SUMMARY

In some embodiments of the invention, a method of transforming measurements of a device under test (DUT) produced by a test system is provided. The method comprises determining a port-specific difference array, wherein the difference array describes a difference between a first test fixture and a second test fixture at a corresponding test port of the test fixtures. The method further comprises measuring a performance of the DUT using the test system, wherein the DUT is mounted in the second test fixture. The method further comprises applying the port-specific difference array, such that the measured DUT performance approximates a hypothetical DUT performance for the DUT mounted in the first test fixture and measured with the test system.

In some embodiments of the invention, a method of calibrating a test system for more than one test fixture is provided. The method of calibrating comprises measuring parameters of a first test fixture having a calibration standard mounted in the first test fixture. The test system is connected to the first test fixture for the parameter measurements. The method of calibrating further comprises measuring parameters of a second test fixture having the calibration standard similarly mounted in the second test fixture. The test system is connected to the second test fixture for the parameter measurements. The method of calibrating further comprises adjusting a calibration of the test system using differences between the measured parameters for corresponding ports of each test fixture. The adjusted calibration is a port-specific calibration of the test system, such that measurements taken with the test system for a device under test (DUT) in either test fixture approximate each other.

In some embodiments of the invention, a method of calibrating a test system for more than one test fixture is provided. The method of calibrating comprises connecting the test system to a first test fixture and measuring parameters of the first test fixture according to a calibration standard. The method of calibrating further comprises connecting the test system to a second test fixture and measuring parameters of the second test fixture according to the calibration standard. The method further comprises calculating a set of calibration factors according to the measured parameters of the test fixtures, and adjusting the calibration factors according to the calibration factors, such that a measurement of a device under test (DUT) yields approximately the same result regardless of which of the two test fixtures is utilized in the DUT measurement.

In some embodiments of the invention, a method of matching measurements of a device under test (DUT) in a second test fixture to hypothetical measurements of the DUT in a first test fixture using a test system is provided. The method comprises determining a port-specific difference array that describes a difference between the first test fixture and the second test fixture at a corresponding test port of the test fixtures. An element of the difference array is determined using measurements of a set of calibration standards in the test fixtures. The measurements are performed at a plurality of frequencies with the test system.

In some embodiments of the invention, a test system that measures a device under test (DUT) using different test fixtures is provided. The test system comprises test equipment; a test fixture that interfaces the DUT to the test equipment; a computer connected to receive and process data from the test equipment; and a computer program executed by the computer. The computer program comprises instructions that, when executed by the computer, implement determining a port-specific difference array that adjusts for a difference between a first test fixture and a second test fixture when each is used to interface the DUT for measurements.

Certain embodiments of the present invention have other features in addition to and in lieu of the features described hereinabove. These and other features of the invention are detailed below with reference to the following drawings.

BRIEF DESCRIPTION OF THE DRAWINGS

The various features and embodiments of the present invention may be more readily understood with reference to the following detailed description taken in conjunction with the accompanying drawings, where like reference numerals designate like structural elements, and in which.

DETAILED DESCRIPTION

Figure 1:
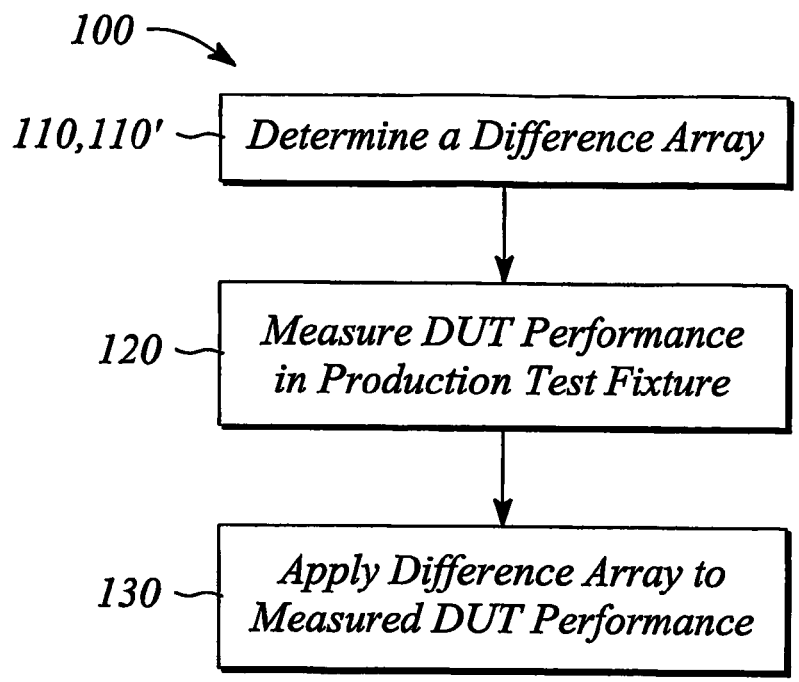
FIG. 1 illustrates a flow chart of a method of transforming measurements of a device under test according to an embodiment of the present invention.

Various embodiments of present invention facilitate measuring a device under test (DUT) in more than one test fixture and calibrating test equipment for use with more than one test fixture. According to the various embodiments of the present invention, measurements of the DUT using a second or production test fixture are 'corrected' or transformed to 'match' or correspond to hypothetical measurements of the DUT taken with the DUT in a first or reference test fixture. In particular, the measurements of the DUT taken with the DUT in the production test fixture are corrected or transformed such that the measurements approximately equal measurements of the DUT that would have been produced had the measurements been performed with the DUT in the reference test fixture. In some embodiments, the correspondence between test fixture measurements is provided in conjunction with a 'calibration' of the test equipment that includes effects of differences between the test fixtures on measured DUT performance. In other embodiments, a measurement transformation is provided that directly adjusts the DUT measurements for differences between the second test fixture and the first test fixture.

Embodiments of the present invention are well suited to performing so-called 'standards-based calibration' of test equipment or test systems that employ 'in-fixture' testing or measuring of the DUT. Test equipment or a test system to which certain embodiments of the present invention are applicable include, but are not limited to, a scalar network analyzer, a vector network analyzer (VNA) impedance analyzers, power meters, and spectrum analyzers.

The term 'in-fixture testing', as used herein, refers to testing a DUT while the DUT is mounted in a test fixture. In general, the test fixture serves two principal roles: adapting a standard interface of the test system (e.g., VNA) to that of the DUT, and physically/electrically mimicking the mounting environment of the DUT. The test fixture can be as simple or as complex as is required by the test being performed on the DUT. For example, a typical standard interface for a VNA is a set of coaxial cables having one of several standardized connector types on terminating ends. The test fixture can serve as a transition or adaptor between the standardized connectors of the coaxial cables and a non-standard DUT interface (e.g. solder pin or tab). In other situations, the test fixture may provide mounting and power connections as well as serve as an interface adaptor for a DUT that lacks standardized connectors. Alternatively, the test fixture may be simply a connector on the end of a cable, or a connector adaptor that adapts one connector type to another, in a case where the DUT has standardized connectors. The test fixture may even be a null fixture having zero loss, zero electrical length and no parasitics. One skilled in the art is familiar with test fixtures and their use in conjunction with testing DUTs.

As used herein, an 'unknown' or 'poorly known' measurement or 'calibration' standard is one for which the performance parameters and/or a corresponding set of calibration standard coefficients are either completely unknown or are not known with sufficient accuracy over a frequency range of interest to perform a desired measurement or calibration using conventional methods. In some embodiments, the unknown standard approximates one type of a known standard used in a conventional standards-based calibration. In the case of using a VNA as the test system, the usual performance parameters are S-parameters. An operational range of the DUT typically defines the frequency range of interest. Embodiments of the present invention may include or involve a broader frequency range than the frequency range of interest for the DUT to provide desired or adequate calibration or transformation. One skilled in the art can readily determine a frequency range given a frequency range of interest of the DUT without undue experimentation.

Furthermore, it should be noted that, while the designation of 'reference' and of 'production' are used herein to distinguish between a first test fixture and a second test fixture, respectively, the designation is arbitrary and purely for discussion purposes. That is, the various embodiments of the present invention may be used equally well to transform the measurements of the DUT in the reference test fixture into measurements corresponding to the DUT as if measured in the production test fixture, for example. Furthermore, the first and second test fixtures may be two different production fixtures or two different reference fixtures. Moreover, the various embodiments are not limited to two such test fixtures and can be more than two.

FIG. 1 illustrates a flow chart of a method 100 of transforming measurements of a device under test (DUT) according to an embodiment of the present invention. The method 100 of transforming measurements essentially relates, 'matches', or correlates measurements of DUT performance in a second or production test fixture with corresponding hypothetical measurements of DUT performance in a first or reference test fixture. Once transformed according to the method 100, the measurements of DUT performance for the DUT in the production test fixture appear as if the measurements were made or taken with the DUT in the reference test fixture. As such, the adjusted measurements essentially account for effects of differences between the production test fixture and the reference test fixture on the measured performance according to the method 100.

As illustrated in FIG. 1, the method 100 of transforming measurements comprises determining 110 a port-specific difference array, wherein the difference array describes a difference between a first test fixture and a second test fixture at test ports of the fixtures. The first and second test fixtures are each adapted for testing the DUT. In general, a separate difference array is determined 110 for each of corresponding ports of the test fixtures. That is, for each port of the first test fixture and a corresponding port of the second test fixture, a difference array 110 is determined. As such, the difference array is 'port-specific'.

For example, a first difference array is determined 110 that describes a performance difference between a first test port of the first test fixture and a first test port of the second test fixture. A second difference array is determined 110 for the second port of each of the first and second test fixtures, and so on. In general, N separate port-specific difference arrays are determined 110 for test fixtures having N ports (i.e., N-port test fixtures), where N is an integer greater than or equal to '1'. In some embodiments, N is greater than or equal to '3'.

In some embodiments, determining 110 the port-specific difference array comprises measuring characteristics of a set of measurement or calibration standards at a port of the first or reference test fixture and at a corresponding port of the second or production test fixture, wherein the calibration standards of the set are separately inserted in each of the test fixtures. In some of these embodiments, such as those described below with reference to FIG. 4, the calibration standards of the set essentially isolate the port from other ports of the test fixture during measuring 112. In addition, the calibration standards are generally chosen to have characteristics that correspond to or are compatible with characteristics of the DUT for which performance is being measured. Specific characteristics of the calibration standards need not be known. In other words, the calibration standards may be unknown standards. While unknown standards are employed, each of the standards in the set differs in terms of its performance parameters from performance parameters of other standards in the set. In some embodiments, the difference between standards is essentially maximized with respect to a domain of the performance parameters.

For example, when measuring 112 a DUT with a VNA, the set of standards may include a first standard that approximates an open circuit (i.e., an open or 'o'), a second standard that approximates a short circuit (i.e., a short or 's'), and a third standard that approximates a load (i.e., a load or 'l'). Such a set of standards is often referred to as an OSL standard set. As one skilled in the art may readily attest, a short, an open and a load are standards that have S-parameters essentially maximally separated from one another in the S-parameter domain (i.e., on the Smith chart).

In other of these embodiments, a set of calibration standards that connect pairs of ports to one another is used as opposed to the set of standards that essentially isolate the ports, as described above. In such embodiments, such as those described below with reference to FIG. 5, determining 110' port-specific difference arrays comprises measuring 112' characteristics of the set of calibration standards at pairs of ports of the reference test fixture and at corresponding port pairs of the production test fixture. The calibration standards of the set are separately inserted in each test fixtures and the set of standards comprises enough standards to connect all combinations of ports (i.e., all port pairs) in the test fixtures as pairs.

For example, when measuring S-parameters of a 3-port DUT using a VNA, each of the test fixtures may have three ports. Likewise, the set of calibration standards may comprise three so-called thru standards. As used herein, a thru standard provides a relatively low-loss signal transmission path between a pair of ports of the test fixture. Thus, a first thru (e.g., $thru_{12}$) may connect Port-1 to Port-2, a second thru (e.g., $thru_{13}$) may connect Port-1 to Port-3 and a third thru (e.g., $thru_{23}$) may connect Port-2 to Port-3. As such, for the example, the three thru standards together connect all possible combinations of ports in the exemplary 3-port test fixture as port pairs.

Determining 110, 110' further comprises solving for elements of the difference array from the results of measuring. In some embodiments, such as those described below with reference to FIG. 4, solving 114 comprises solving several equations for several unknowns using the results of measuring 112. The unknowns solved 114 for represent the difference array elements being sought. Thus, by solving 114 for the unknowns using the measured 112 results, the elements of the difference array are determined 110.

For example, if S-parameters are being measured and the test fixture is assumed to be passive and reciprocal, then the difference array may be defined in terms of three independent elements. As such, measuring 112 a set of three standards produces sufficient information to solve three equations for three unknowns to determine 110 the port-specific difference array.

In some embodiments, such as those described below with reference to FIG. 5, solving 114' comprises optimizing a model representing the port-specific difference array using the measured 112' results. In such embodiments, a model is constructed that essentially represents a 'measurement conversion' between the test fixtures. The model accepts the measured 112' results for the second test fixture as an input and produces converted measurements as an output. The converted measurements are compared to the measurements associated with the first test fixture. Parameters of the model are adjusted during the optimization until a difference between the converted measurements and the measurements for the first test fixture is minimized. The parameters of the model produced by the optimization represent the elements of the port-specific difference array being sought, albeit an approximation of the true elements.

For example, the model may convert results measured for the production test fixture into results corresponding to the reference test fixture. Through parameter adjustment during optimization, the difference between the converted production test fixture measured results and the reference test fixture measured results is minimized with respect to a given metric. Once the metric is minimized, the optimization is terminated. When the optimization terminates, the parameters of the model represent the approximate elements of the determined 110' difference array.

The set of calibration standards used in measuring 112, 112' may optionally comprise additional standards beyond those used to connect to the ports or connect port pairs. For example, in addition to three thru standards, the set for measuring 112' may also comprise one or more of a short, an open, and a load standard. The additional standards may be helpful to better define a solution space of the difference array computation 114, 114', especially in the presence of measurement noise, for example. Moreover, it is within the scope of the invention that determining 110, 110' a port-specific difference array may comprise combinations of the steps other than that specifically illustrated FIGS. 4 and 5, such as either measuring 112 characteristics and solving 114' for elements or measuring 112' characteristics and solving 114 for elements, depending on the embodiment.

The method 100 of transforming measurements further comprises measuring 120 a performance of the DUT, wherein the DUT is mounted in the second test fixture. In particular, the DUT is mounted in the second test fixture and a test system is employed to make one or more performance measurements of the DUT in the second test fixture. For example, the test system may be a VNA and the performance measurements may comprise S-parameters of the DUT as a function of frequency.

The method 100 of transforming measurements further comprises applying 130 the port-specific difference array to the measured 120 performance of the DUT, such that the DUT performance is adjusted to approximate a hypothetical DUT performance with the DUT mounted in the first test fixture. In other words, after applying 130 the difference array, measured performance of the DUT in the second test fixture is made to appear (i.e., 'transformed') as if the DUT had been mounted and measured in the first test fixture.

According to the various embodiments of the present invention, performance characteristics of the individual test fixtures need not be known a priori. In particular, the embodiments do not depend on precision characterization of the test fixtures. Moreover, the performance characteristics of the test fixtures need not be determined precisely through the use of conventional calibration methods using precision 'in-fixture' calibration standards. Moreover, the embodiments do not require the use of precision or known calibration standards.

Instead, the difference array is employed, as described hereinabove with respect to method 100 according to the present invention, to replace such conventional requirements. The difference array essentially represents a 'mathematical difference' between a performance of the reference test fixture and the production test fixture. As such, the difference array 'links' measurements of DUTs in each of the test fixtures. Once determined 110, the difference array may be applied 130 to results of measuring 120 the DUT in one of the test fixtures to transform the measurements into equivalent measurements representing a performance of the DUT in the other test fixture. Alternatively, the difference array may be employed to 'correct' calibration coefficients of the test system, such that measurements of the DUT in the production test fixture, using the adjusted calibrated test system, are transformed to be essentially equal to those as if produced by a normally calibrated test system for the DUT in the reference test fixture.

For example, the DUT is measured 120 in the production test fixture. Then, the determined 110 port-specific difference array, linking the production test fixture to a reference test fixture, is applied 130 to the DUT measurements to yield transformed measurements. As has been described, the transformed measurements essentially represent how the DUT would have performed had the DUT been measured in the reference test fixture. Thus, the port-specific difference array effectively facilitates a correlation or 'matching' between measurements when using the production test fixture and measurements when hypothetically using the reference test fixture.

In terms of signal flow diagrams, the difference array is essentially an 'error adaptor' that is cascaded with a port of the production test fixture. The error adaptor mathematically transforms measurements taken at the port into measurements corresponding to a port of the reference test fixture. That is, the error adaptor adapts the measurements to 'remove' an error between measurements from the respective test fixtures.

Individual error adaptors (i.e., one for each port of the test fixture) of the present invention, which are associated with a signal flow graph of the test fixture, can be merged with normal vector error correction arrays conventionally used in test systems to modify the error correction terms. As such, conventional application of error correction includes the effects of the difference array. Thus, measurement transformations may be achieved with essentially no additional data processing. One skilled in the art is familiar with conventional error correction.

For example, a discussion of error correction applied to VNAs as well as a discussion of calibration standards, SOLT and TRL calibration methods and conventional in-fixture calibration are provided in Agilent application notes AN1287-3, *Applying Error Correction to Network Analyzer Measurenents*, PN 8510-5A, *Specifying Calibration Standards for the Agilent 8510 Network Analyzer*, and AN 1287-9, *In-Fixture Measurement Using Vector Network Analyzers*, all three of which are incorporated herein by reference.

Hereinbelow, 'array' generally will be used when discussing performance in terms of S-parameters while 'adaptor' will be used when describing performance in terms of a signal flow graph or diagram. However, since there is a one-to-one correspondence between S-parameters and a signal flow diagram of those S-parameters, the distinction between 'array' and 'adaptor' may be unimportant in much of what follows.

Conceptually, the signal flow diagram of the error adaptor may be thought of as a cascade of two 2-port adaptors that is applied to a port of a production test fixture (e.g., the second test fixture). When so applied, the error adaptor essentially makes the production test fixture 'appear' as if it where a port of a reference test fixture (e.g., the first test fixture). A first adaptor of the two 2-port adaptors, which is applied to the port of the production test fixture, essentially represents an 'inverse' adaptor. The inverse adaptor is defined as a 2-port adaptor that, when cascaded with a flow diagram representing the test fixture port, produces a 'unit' flow diagram. A 'unit' flow diagram is represented by an S-parameter matrix or array with zeros in diagonal elements and unity in off-diagonal elements. In other words, the inverse adaptor essentially cancels out an effect of a performance of the port on measurements of the DUT. A second adaptor of the two 2-port adaptors essentially introduces a performance of a corresponding port from the reference test fixture (e.g., the first test fixture). Thus, the cascade of the two 2-port adaptors replaces a port-related performance of the test fixture with that of another test fixture. Moreover, the signal flow diagram of the error adaptor may be substituted for the cascaded two 2-port adaptors, yielding an equivalent flow diagram of the test fixture port.

Figure 2:
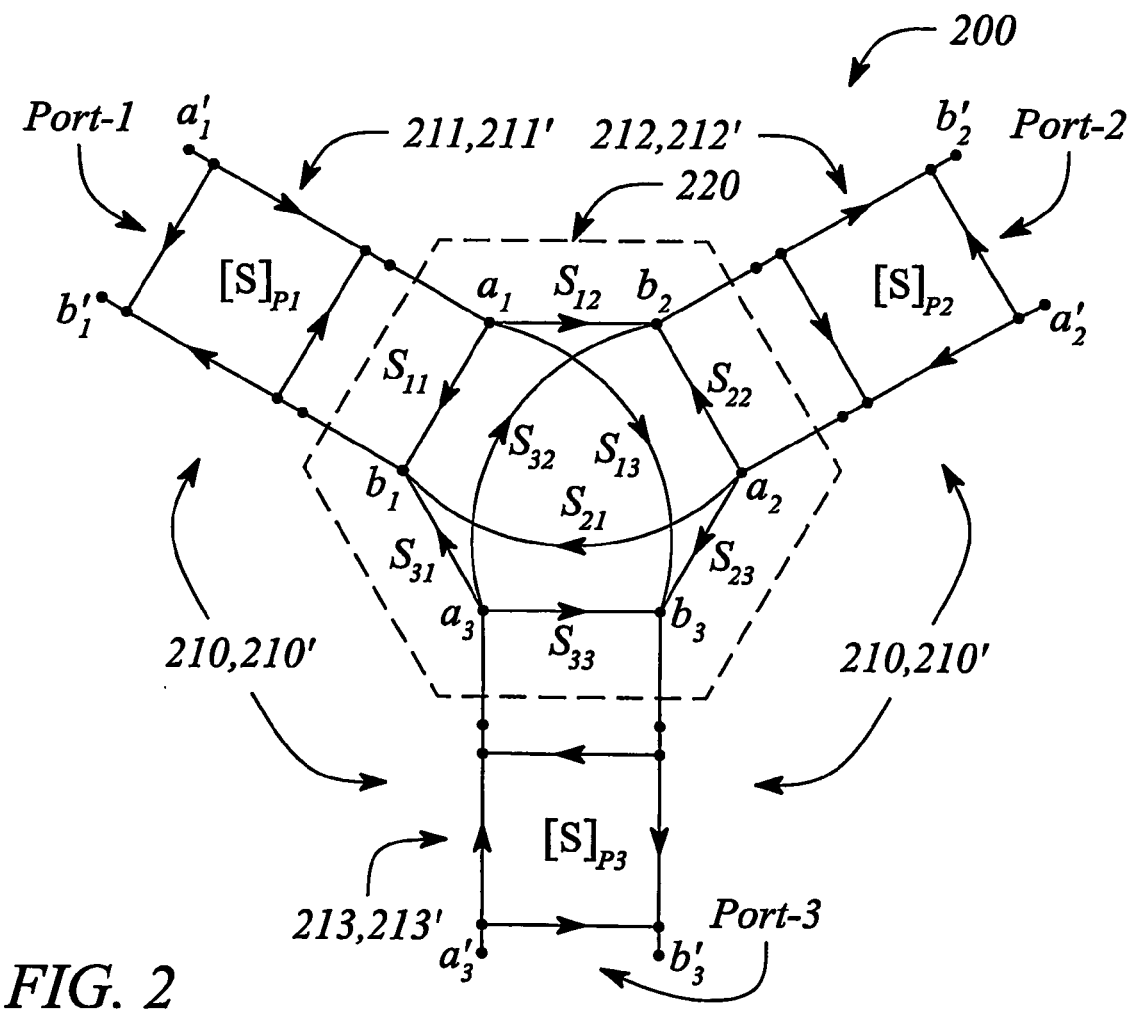
FIG. 2 illustrates an S-parameter signal flow diagram of an exemplary test fixture and a device under test according to an embodiment of the present invention.

FIG. 2 illustrates an S-parameter signal flow diagram 200 of an exemplary test fixture 210 and a device under test (DUT) 220, according to an embodiment of the present invention. Note that, while illustrated as a 3-port test fixture 210 and a corresponding 3-port DUT 220, the discussion hereinbelow generally applies to testing of an N-port DUT with an N-port test fixture, where N equals a positive integer. The use of three ports herein is for discussion purposes only, and not by way of limitation. Moreover, the use of S-parameters as that being measured for the DUT is for discussion purposes only. In addition, it is assumed hereinbelow that the test fixture 210 is passive and reciprocal, for discussion purposes only.

As illustrated in FIG. 2 by way of example, the test fixture 210 and the DUT 220 each have three ports. Each port of the DUT 220 is connected to a corresponding port or portion 211, 212, 213 of the test fixture 210 associated with the port (i.e., 'port portion'). Thus, a first port ($a_1$-$b_1$) of the DUT 220 is connected to a first port portion 211 of the test fixture 210, a second port ($a_2$-$b_2$) of the DUT 220 is connected to a second port portion 212 of the test fixture 210, and a third port ($a_3$-$b_3$) of the DUT 220 is connected to a third port portion 213 of the test fixture 210.

A test system for performing S-parameter measurements (not illustrated) interfaces and makes measurements of the test fixture 210 and the DUT 220 mounted therein at three test fixture ports Port-1, Port-2, Port-3. Thus, the test system measures a combined performance of the test fixture 210 and the DUT 220 mounted therein. That is, the performance of the DUT 220 is influenced by the port portions 211, 212, 213 of the test fixture.

In general, the test fixture 210 flow diagram may be representative of either a reference test fixture 210 or a production test fixture 210'. When the test fixture 210, 210' is the reference test fixture 210, the S-parameters of the respective port portions 211, 212, 213 of the reference test fixture 210 are measured along with S-parameters of the DUT 220 by the test system. Alternatively, when the test fixture 210, 210' is the production test fixture 210', measurements of the test fixture 210' and the DUT 220 represent a combination of the S-parameters of the respective port portions 211', 212', 213' of the production test fixture and the S-parameters of the DUT 220. It is assumed that S-parameter performance of the reference test fixture 210 and the production test fixture 210' differ at least at one of the port portions 211, 211', 212, 212', 213, 213'.

For example, the first port portion 211 of the reference test fixture 210 may be represented by an S-parameter array $[S]_{P1}^R$, while the first port portion 211' of the production test fixture 210' may be represented by an S-parameter array $[S]_{P1}^P$. Similarly, S-parameter arrays $[S]_{P2}^R$ and $[S]_{P2}^P$ may represent the S-parameters of the second port portions 211, 211' of the reference and production test fixtures 210, 210', respectively, while S-parameter arrays $[S]_{P3}^R$ and $[S]_{P3}^P$ represent the S-parameters of the third port portions 211, 211' of the reference and production test fixtures 210, 210', respectively.

As described hereinabove, the error adaptor representing the determined 110 difference array is developed to convert measurements of the DUT 220 in the production test fixture 210' into measurements representing what would have been measured if the DUT 220 were mounted in the reference test fixture 210. Since the S-parameters of the DUT 220 are the same regardless of which test fixture 210 is used, the differences observed in the measured results for the reference and production test fixtures are entirely 'captured' by the respective S-parameter arrays or port portion 211, 212, 213 signal flow diagrams of the reference and production test fixtures 210, 210', respectively.

Figure 3A:
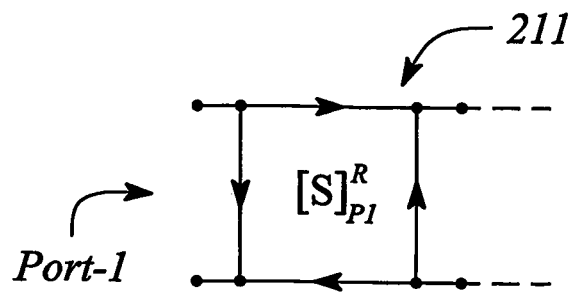
FIG. 3A illustrates signal flow diagrams of port portions of a reference test fixture and a production test fixture according to an embodiment of the present invention.
Figure 3B:
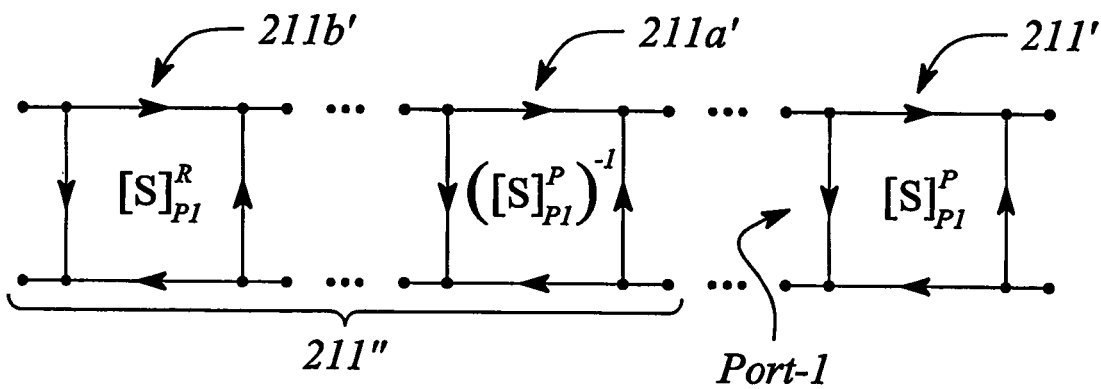
FIG. 3B illustrates a conceptual application of a cascade of two 2-port adaptors to the signal flow diagram of a production test fixture port portion according to an embodiment of the present invention.
Figure 3C:
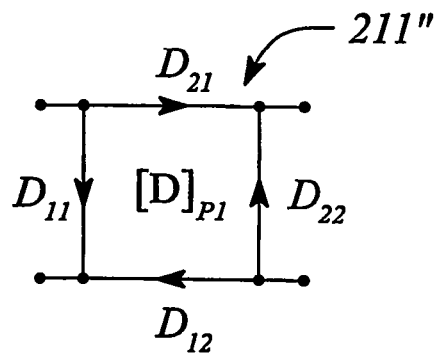
FIG. 3C illustrates an error adaptor cascaded with the signal flow diagram of the production test fixture port portion where the error adaptor is equivalent to the two 2-port adaptors illustrated in FIG. 3B.

For example, consider Port-1 of each of the reference test fixture 210 and the production test fixture 210', where the port portions 211, 211' of the reference and production test fixtures 210, 210' are respectively represented by S-parameter arrays $[S]_{P1}^R$ and $[S]_{P1}^P$. FIG. 3A illustrates signal flow diagrams of port portions 211, 211' of the reference and production test fixtures 210, 210', according to an embodiment of the present invention. FIG. 3B illustrates a conceptual application of a cascade of two 2-port adaptors 211$a'$, 211$b'$ (i.e., an inverse adaptor 211$a'$ and an adaptor 211$b'$ corresponding to the reference test fixture 210 port portion 211) to the signal flow diagram of the production test fixture 210' port portion 211', according to an embodiment of the present invention. FIG. 3C illustrates an error adaptor 211" cascaded with the signal flow diagram of the production test fixture 210' port portion 211', where the error adaptor 211" is equivalent to the cascaded two 2-port adaptors 211$a'$, 211$b'$ illustrated in FIG. 3B. Measurements made of a DUT 220 mounted in the production test fixture 210' under either the conditions represented in FIG. 3B or FIG. 3C would appear as if the measurements were taken with the DUT 220 mounted in the reference test fixture 210.

Figure 3D:
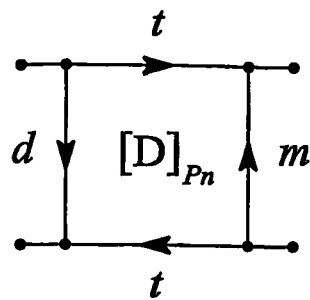
FIG. 3D illustrates a flow diagram of an error adaptor described by a difference array according to an embodiment of the present invention.

FIG. 3D illustrates a flow diagram of an error adaptor described by the port-specific difference array $[D]_{Pn}$, where the subscript 'Pn' corresponds to a port to which the error adaptor (or difference array) is applied (e.g., P1, P2, . . . ), according to an embodiment of the present invention. The elements of the difference array $[D]_{Pn}$ correspond to, or are each associated with, vertices of the signal flow diagram, as illustrated in FIG. 3D. Moreover, since the test fixture 210, 210' is passive and reciprocal, the difference array $[D]_{Pn}$ similarly is reciprocal. Thus, if the difference array is described in terms of matrix elements $D_{11}$, $D_{21}$, $D_{22}$ and $D_{12}$, then the two off-diagonal matrix elements are equal (i.e., $D_{21}=D_{12}$). A difference array $[D]_{P1}$ is equivalent to the error adaptor 211" illustrated in FIG. 3C.

Using a first notation for the error adaptor illustrated in FIG. 3D, each 'transmission' branch (e.g., forward and reverse) of the error adaptor corresponds to an off-diagonal matrix element. Thus, since the off-diagonal matrix elements are equal to one another, both transmission branches may be represented by a single 'transmission term' t, as illustrated in FIG. 3D (i.e., $t=D_{21}=D_{12}$). Furthermore, under such a notation, a first diagonal term $D_{11}$ of the difference array corresponds to a 'directivity' branch or term d, while a second diagonal term $D_{22}$ corresponds to a 'source match' branch or term labeled m, as illustrated in FIG. 3D.

Figure 3E:
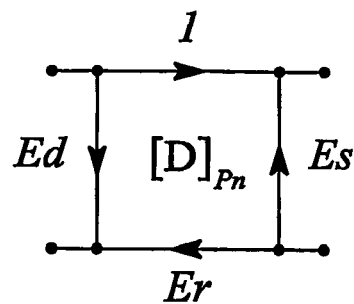
FIG. 3E illustrates the error adaptor of FIG. 3D using a second notation according to an embodiment of the present invention.

FIG. 3E illustrates the error adaptor of FIG. 3D using a second notation according to an embodiment of the present invention. Specifically, the second notation one that is consistent with a notation often employed in error correction techniques and methodologies associated with test systems, such as, but not limited to, vector network analyzers.

According to the second notation in FIG. 3E, the transmission branches of the error adaptor are normalized such that a forward branch equals one (e.g., '1' in FIG. 3E). Under the normalization, a reverse branch, referred to herein as a reflection tracking term Er, is a product of the off-diagonal matrix elements of the difference array (i.e., $Er=D_{21} \cdot D_{12}$). The normalization does not affect the directivity and matching terms of the error adaptor. As such, a directivity term Ed equals the first diagonal element $D_{11}$, while a source match term Es equals the second diagonal element $D_{22}$, according to the second notation illustrated in FIG. 3E. The second notation is well suited to determining the different array elements using three calibration standards, as will be described hereinbelow.

It should be kept in mind however, while providing notational convenience under certain circumstances, the first and second notations described hereinabove with respect to FIGS. 3D and 3E are essentially equivalent approaches to describing the various port-specific error adaptors in terms of the port-specific difference array $[D]_{Pn}$. Also, in general, the elements of the difference array $[D]_{Pn}$ (i.e., $D_{11}$, $D_{21}$, $D_{22}$ and $D_{12}$) as well as the various error adaptor terms (i.e., t, d, m or Er, Ed, Es) are complex valued, each element/term having a magnitude and a phase or a real part and an imaginary part. Moreover, when considering measurements across a range or band of frequencies, the difference array elements and error adaptor terms are functions of frequency. In particular, each difference array element and error adaptor term may be described by a sequence of data points, each data point corresponding to a different frequency within the frequency range of the measurements (e.g., $Er=\{|Er(f)|, arg[Er(f)]\}$.

Referring again to FIG. 3E, some embodiments of determining 110 the port-specific difference array $[D]_{Pn}$ from measurements of the reference test fixture 210 and the production test fixture 210' yield the reflection tracking term Er. As mentioned above, the reflection tracking term Er is essentially a complex product of the difference array elements $D_{21}$ and $D_{12}$. In some situations, the reflection tracking term Er must be separated into the respective difference array elements $D_{21}$ $D_{12}$. Such situations include when the difference array $[D]_{Pn}$ is employed to transform measurements of the DUT and/or correct a calibration of the test system to account for more than one test fixture according to various embodiments of the present invention. When such a separation of the difference array elements $D_{21}$ and $D_{12}$ is desired, a complex square root determined according to the present invention may be employed.

As one skilled in the art is well aware, determining a complex square root is often difficult due to various ambiguities associated therewith. For example, ambiguity in a phase of the complex square root generally is present when the test fixtures 210, 210' have an electrical length of more than about 180 degrees at a highest frequency within the frequency range. Fortunately, according to the embodiments of the present invention, an appropriate solution for the complex square root essentially free of such ambiguities may be arrived at using measurements 112 of the test fixtures 210, 210' at several frequencies or frequency points. Specifically, a sequence of data points representing the complex product (i.e., $D_{21} \cdot D_{12}$) corresponding to several measurement frequency points may be employed to eliminate ambiguities in the complex square root determination.

Note that the test fixtures 210, 210' are typically direct current (DC) coupled, or at least have structural characteristics such that the frequency responses of the test fixtures 210, 210' are well behaved and/or controlled over the frequency range. As such, a group delay of each of the test fixtures 210, 210' may be assumed to be relatively constant over the frequency range. Assuming that measurement data from measuring 112 the test fixtures 210, 210' are not 'under-sampled', several data points within data corresponding to the complex product or equivalently, the reflection tracking term Er, may be used to 'unwrap' a phase of the complex product, thereby facilitating unambiguous determining of a phase of the complex square root at each respective frequency. In some embodiments, the several data points are employed to estimate a group delay for the complex product also, further assisting in determining the phase of the complex square root. As used herein, 'under-sampled' means that more than a 180-degree phase shift occurs between data points.

According to some embodiments, determining the complex square root phase comprises unwrapping the phase of the complex product data points to remove phase transition points that occur at 180 degree phase intervals. Unwrapping the phase comprises examining data points within the complex product data as a function of frequency and determining if a phase change of more than 180 degrees occurs between adjacent data points. When the phase change is greater than 180 degrees, a 'phase wrap' is assumed. An amount of phase equal to 360 degrees is then subtracted from each data point of the complex product data following a phase wrap (i.e., higher in frequency than a previous data point preceding the phase wrap). The unwrapping is performed for all data points of the complex product. Following unwrapping, the phase, as a function of frequency, within the data points may exceed 360 degrees.

The unwrapped phase of each of the data points is then divided by two to yield a phase portion or phase of the data points (i.e., data point phase as a function of frequency) for the appropriate square root of the complex product. A positive, standard (i.e., non-complex) square root of each magnitude portion or magnitude of the data points (i.e., data point magnitude as a function of frequency) is computed to provide the magnitude portion of the appropriate square root of the complex product.

In some embodiments, the group delay is estimated from the phase-unwrapped data points by selecting a pair of complex product data points. For example, two complex product data points having a predetermined phase difference therebetween may be selected and used as the data point pair. If the group delay is constant, the selection of the data point pair may be essentially arbitrary. In some embodiments, the pair of data points is selected such that noise that may be present in the measurement does not cause a substantial change in the computed delay result. If there are no data points with sufficient phase change between pairs, the group delay may be assumed to be small enough to be ignored (i.e., group delay ≅0). When the group delay is not constant or when noise in the data is a problem, several pairs may be selected and the results obtained hereinabove averaged to determine the estimated group delay.

An estimate of the group delay is then computed from the data points of the first pair using conventional group delay calculation methods known in the art. In some embodiments, the group delay estimate is computed as a ratio of the phase difference over a frequency difference for the pair of data points.

From the group delay estimate, a phase shift between DC and a first data point in the set of data points is calculated by multiplying the group delay and a frequency of a first data point in the set (i.e., a complex product data point at a low end of the frequency range). The result of the multiplication is expressed as phase in degrees. A number of complete 360 degree phase wraps represented by the calculated phase of the first data point is then determined. For example, the calculated phase of the first data point may be divided by 360 and the result truncated to a whole number. This whole number times 360 degrees is subtracted from the previously unwrapped data point phases. Finally, the unwrapped phase of each of the data points is divided by two to yield a phase portion or phase of the data points, as described hereinabove. Having determined the square root, the separation of the difference array elements $D_{21}$ and $D_{12}$ is accomplished.

Importantly, as discussed hereinabove, once the elements of the port-specific difference array $[D]_{Pn}$ are determined 110 for each port of the test fixture 210, 210', measurements 120 of the DUT 220 in the production test fixture 210' can be made to appear, through application 130 of the error adaptor illustrated in FIG. 3E, as if the measurements were of the DUT 220 mounted in the reference test fixture 210. In various embodiments, the present invention determines 110 the port-specific difference array $[D]_{Pn}$ or an equivalent thereof. Moreover, according to the embodiments, the port-specific difference array $[D]_{Pn}$ or its equivalent may be determined 110 through measurements of either nonprecision standards or precision standards in the fixtures 210, 210'.

In the discussion that follows, the test system will be assumed to be a vector network analyzer (VNA) that measures S-parameters of the DUT. The test system is represented herein by the VNA solely for the purposes of facilitating discussion and is not intended to limit the scope of the invention in any way. One skilled in the art can readily extend the discussion of calibrating to standards-based calibration of other test systems without undue experimentation. In addition and also for the purposes of discussion only and not by way of limitation, a 3-port DUT and a corresponding 3-port test fixture will be assumed.

Figure 4:
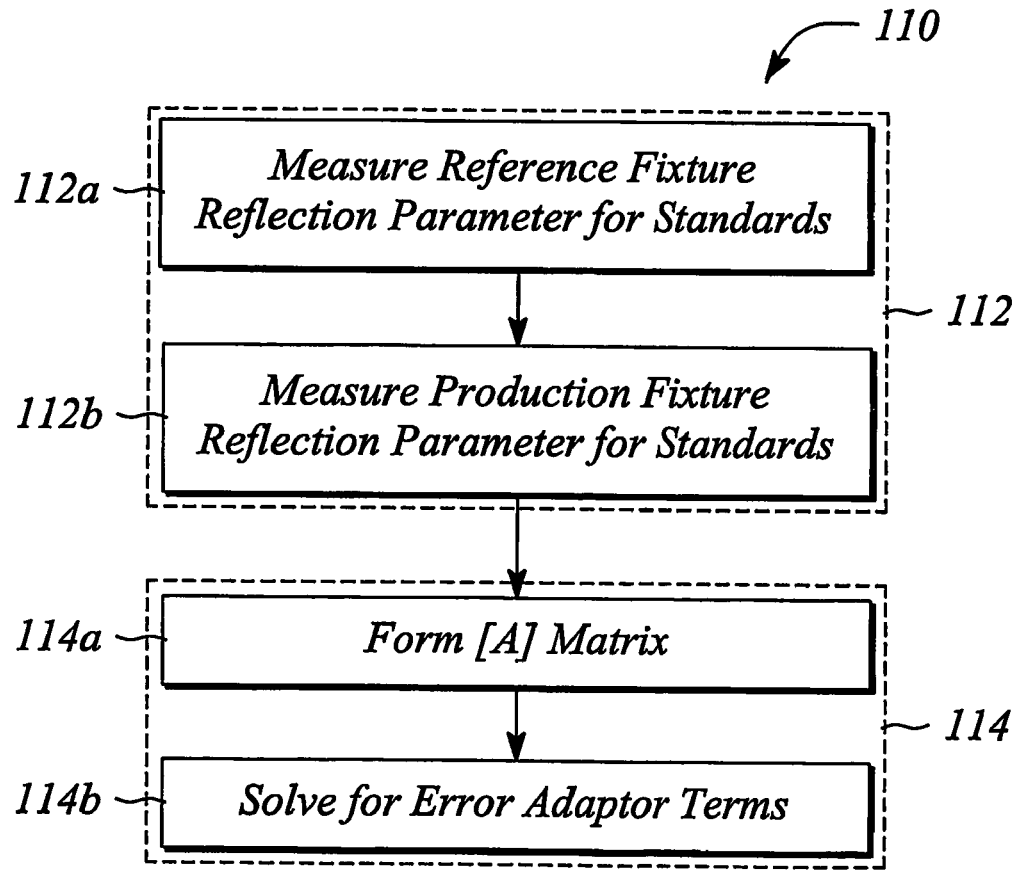
FIG. 4 illustrates a flow chart of an embodiment of determining a difference array according to an embodiment of the method of transforming measurements of the present invention.

FIG. 4 illustrates a flow chart of an embodiment of determining 110 a difference array according to an embodiment of the method 100 of transforming measurements of the present invention. In particular, determining 110 the difference array yields an error adaptor for each port of the test fixture. The port-specific error adaptor is of the form illustrated in and described hereinabove with respect to FIG. 3E and includes adaptor terms Er, Es, and Ed. Hereafter, determining 110 a port-specific difference array may be referred to as determining 110 an error adaptor or a port-specific error adaptor instead.

As mentioned hereinabove, determining 110 the port-specific error adaptor comprises measuring 112 a reflection parameter r of each standard of a set of calibration standards separately in each of the reference test fixture and the production test fixture. In general, the standards of the set employed in measuring 112 are adapted for mounting in the reference and production test fixtures.

In some embodiments, the set of calibration standards comprises three standards referred to herein as an open, a short, and a load, while the set as whole is referred to as an OSL set. As discussed above with respect to determining 110, the open, short and load standards may represent any three devices having differing S-parameters where a separation between the S-parameters of the devices is essentially maximized with respect to one another. In general, the standards may be otherwise unknown.

In some embodiments, the open is a device representing an open circuit, the short is a device representing a short circuit, and the load is a device essentially impedance matched to the test fixture with a relatively low return loss (e.g., −15 dB or better). While precision open, short, and load standards may be employed, it is unnecessary according to the present invention. The reflection characteristic r is measured 1112 at one or more frequency points in the frequency range of interest for the DUT. As such, the reflection parameter r is generally a function of frequency (i.e., Γ(f)). However, for the purposes of discussion and for notational convenience and clarity, the frequency dependence of the measured 1112 refection parameter Γ will be suppressed hereinbelow unless otherwise noted.

Referring to FIG. 4, measuring 112 comprises measuring 112a in the reference fixture the refection parameter r for each standard in the set. The results of measuring 112a are three measured parameters $\Gamma_o^R, \Gamma_s^R, \Gamma_l^R$, where the superscript 'R' indicates that the measurements were performed in reference test fixture and the subscript denotes which of the three standards was measured (i.e., 'o'=open, 's'=short; 'l'=load).

Measuring 112 further comprises measuring 112b in the production test fixture the reflection parameter r for each standard in the set. The results of measuring 112b are three measured parameters $\Gamma_o^P, \Gamma_s^P, \Gamma_l^P$, where the superscript 'P' indicates that the measurements were performed in the production test fixture and the subscript denotes which of the three standards was measured.

Determining 110 further comprises solving 114 for elements of the difference array from the results of measuring 112. As illustrated in FIG. 4, solving 114 comprises forming 114a a matrix [A] defined by $$[A] = \begin{bmatrix} \Gamma_o^R \cdot \Gamma_o^P & 1 & \Gamma_o^P \\ \Gamma_s^R \cdot \Gamma_s^P & 1 & \Gamma_s^P \\ \Gamma_l^R \cdot \Gamma_l^P & 1 & \Gamma_l^P \end{bmatrix} \quad (1)$$

Solving 114 further comprises solving 114b for each of three error adaptor terms Es, Ed, and Er using $$Es = [\Gamma_o^R(\Gamma_l^P - \Gamma_s^P) + \Gamma_l^R(\Gamma_o^P - \Gamma_l^P) + \Gamma_l^R(\Gamma_s^P - \Gamma_o^P)]/|[A]| \quad (2)$$

$$Ed = [\Gamma_o^R \cdot \Gamma_o^P(\Gamma_s^R \cdot \Gamma_l^P - \Gamma_s^P \cdot \Gamma_l^R) + \Gamma_s^R \cdot \Gamma_s^P(\Gamma_l^R \cdot \Gamma_o^P - \Gamma_l^P \cdot \Gamma_o^R) + \Gamma_l^R \cdot \Gamma_l^P(\Gamma_o^R \cdot \Gamma_s^P - \Gamma_o^P \cdot \Gamma_s^R)]/|[A]| \quad (3)$$

$$Er = Es \cdot Ed + [\Gamma_o^R \cdot \Gamma_o^P(\Gamma_l^R - \Gamma_s^R) + \Gamma_s^R \cdot \Gamma_s^P(\Gamma_o^R - \Gamma_l^R) + \Gamma_l^R \cdot \Gamma_l^P(\Gamma_s^R - \Gamma_o^R)]/|[A]| \quad (4)$$

where '|·|' denotes a determinant of a matrix.

Determining 110 an error adaptor, comprising measuring 112a, measuring 112b, forming 114a, and solving 114b, is repeated for each port of the test fixtures. Thus, a separate error adaptor is determined 110 for each port. For example, with a 3-port test fixture (i.e., both the reference and production test fixtures each having three ports), three error adaptors are determined 110 for each test fixture.

The determined 110 error adaptors or terms Es, Ed, and Er thereof may be applied 130 directly to measured 120 performance results for the DUT in accordance with the method 100 of transforming. For example, the error adaptors may be embedded into the measurements using software 'fixturing' capabilities and functions provided by many VNAs such as, but not limited to, the ENA and PNA series vector network analyzers manufactured by Agilent Technologies, Inc., Palo Alto, Calif. Moreover, a computer program may be written and installed in the VNA to prompt a user to sequentially insert each of the OSL standards at each port of each of the production and reference test fixtures. The computer program may also apply 130 the result using built-in embedding algorithms of the VNA, for example.

Figure 5:
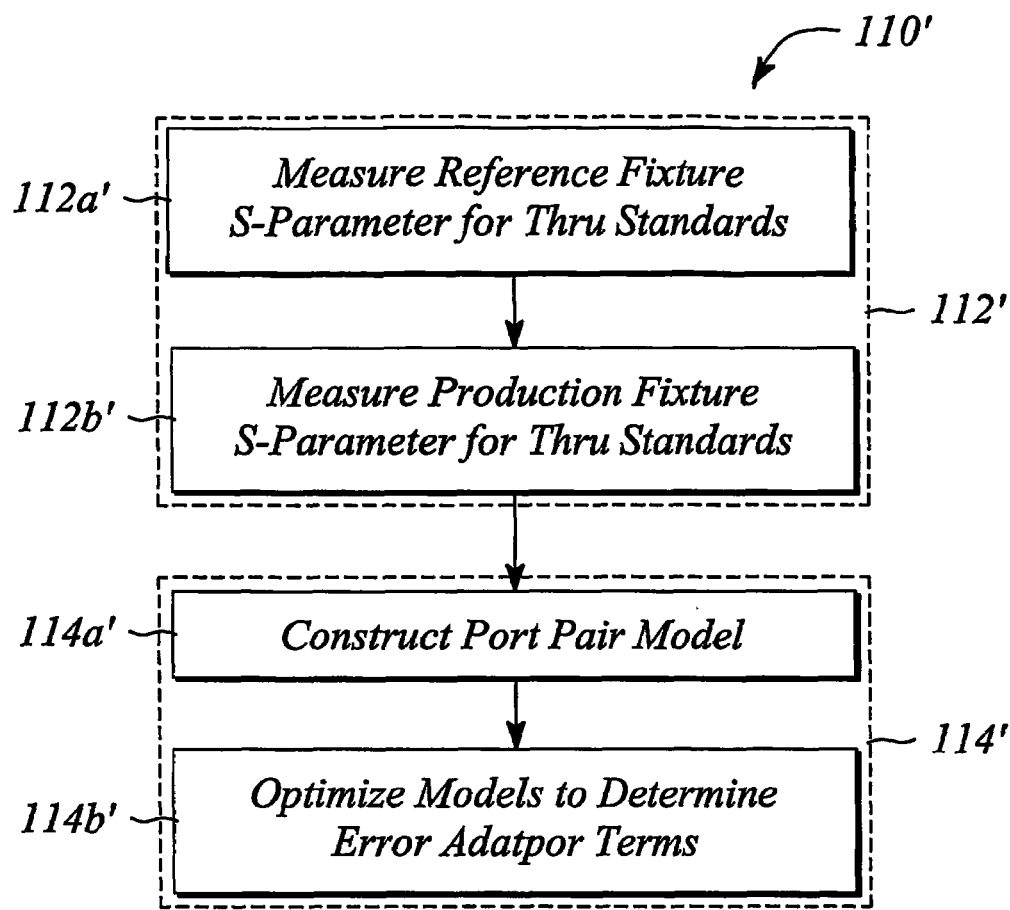
FIG. 5 illustrates a flow chart of another embodiment of determining a difference array according to an embodiment of the method of transforming measurements of the present invention.

FIG. 5 illustrates a flow chart of another embodiment of determining 110' a port-specific difference array according to an embodiment of the method 100 of transforming measurements of the present invention. In particular, determining 110' the difference array yields a port-specific error adaptor of the form illustrated in and described hereinabove with respect to FIG. 3D and includes adaptor terms t, m, and d. Determining 110' may be thought of as comprising both de-embedding and embedding functions into a signal block or difference array. The result when applied 130 is to make the production test fixture measurement 'read' or appear to be the same as those for the reference test fixture.

Determining 110' comprises measuring 112' a set of calibration standards in each of the reference and the production test fixtures. As mentioned hereinabove, determining 110' employs thru standards that do not isolate the individual ports of the test fixture, in contrast to that done with determining 110 described hereinabove with respect to FIG. 4. Instead, the use of thru standards in measuring 112' essentially separates the ports into pairs of ports. For example, for a 3-port test fixture, the port pairs, comprising Port-1/Port-2, Port-1/Port-3, and Port-2/Port-3, are measured 112' using thru standards designated 'thru$_{12}$', 'thru$_{13}$', and 'thru$_{23}$' of the set, respectively. As with the previously mentioned set of calibration standards, the thru standards may be unknown or poorly known standards or may be precision standards.

The thru standards are well suited for use in test fixtures as such standards are often easily implemented in practice. For example, such calibration standards may often be implemented by simply installing bond wires in a package that is adapted for mounting in the test fixture. In some embodiments, additional calibration standards, such as one or more of an open, a short, and a load, may be employed in addition to the thru standards. Also unlike the previously described determining 110 of FIG. 4, determining 110' employs an optimization to arrive at error adaptor terms instead of closed form equations.

Referring to FIG. 5, measuring 112' comprises measuring 112a' S-parameters of each of the thru standards mounted in the reference test fixture. The results of measuring 112a' are three sets of measured S-parameters $[S]_{12}^R$, $[S]_{13}^R$, $[S]_{23}^R$, where the superscript 'R' indicates that the measurements were performed in reference test fixture and the subscript denotes which of the three thru standards was measured (i.e., '12'=thru$_{12}$, '13'=thru$_{13}$; '23'=thru$_{23}$).

Measuring 112' further comprises measuring 112b' S-parameters of each of the thru standards mounted in the production test fixture. The results of measuring 112b' are three sets of measured S-parameters $[S]_{12}^P$, $[S]_{13}^P$, $[\Gamma]_{23}^P$, where the superscript 'P' indicates that the measurements were performed in the production test fixture and the subscript denotes which of the three thru standards was measured.

Determining 110' further comprises solving 114' for elements of the difference array using the results of measuring 112'. As illustrated in FIG. 5, solving 114' comprises constructing 114a' a 'port-pair' model of the production test fixture with error adaptors attached to each port of the port pair. In general, a separate port-pair model is constructed 114a' for each combination of port pairs in the production test fixture.

Figure 6A:
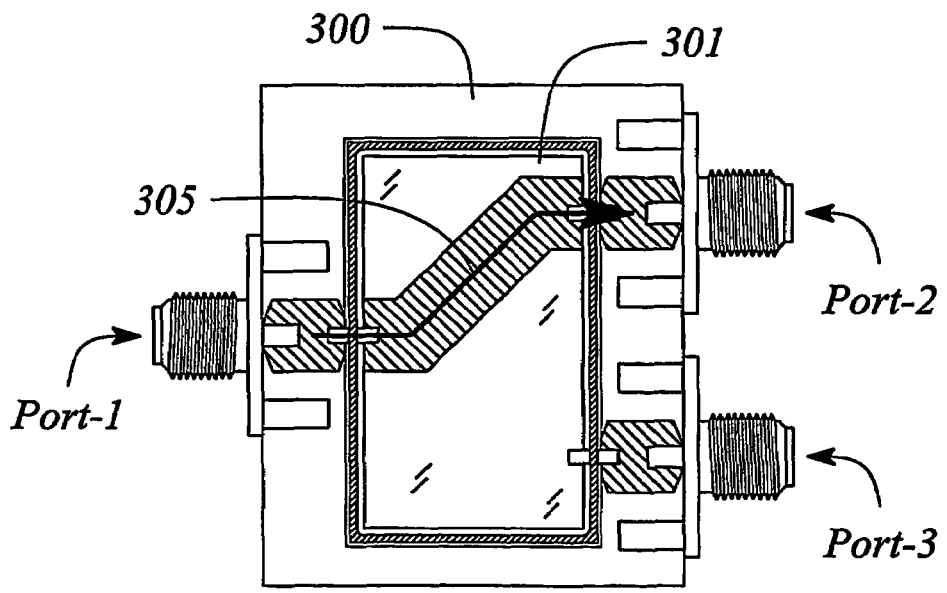
FIG. 6A illustrates a top view of an embodiment of an exemplary production test fixture having three ports with a thru standard mounted therein according to an embodiment of the present invention.

FIG. 6A illustrates a top view of an embodiment of an exemplary production test fixture 300 having three ports (i.e., Port-1, Port-2, Port-3) with the thru$_{12}$ standard 301 mounted therein according to an embodiment of the present invention. An arrow 305 indicates a path from Port-1 to Port-2 provided by the thru$_{12}$ standard 301.

Figure 6B:
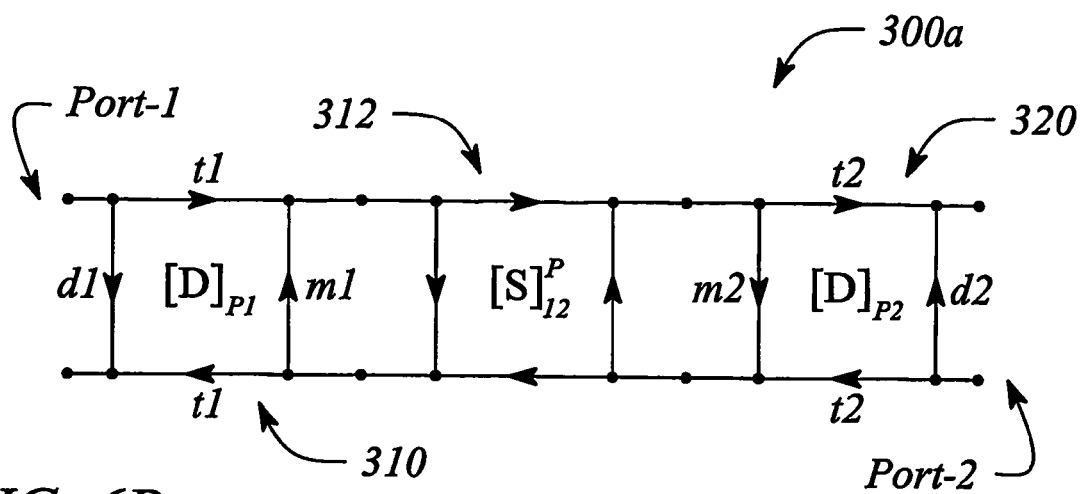
FIG. 6B illustrates a signal flow diagram of an embodiment of a model constructed for a first port pair of the exemplary production test fixture illustrated in FIG. 6A according to an embodiment of the present invention.

FIG. 6B illustrates a signal flow diagram of an embodiment of a port-pair model 300a constructed 114a' for the first port pair (i.e., Port-1/Port-2) of the exemplary production test fixture 300 illustrated in FIG. 6A, according to an embodiment of the present invention. The port-pair model 300a illustrated in FIG. 6B includes a first error adaptor 310 defined by parameters t1, m1, and d1 connected between Port-1 and a model portion 312, representing the measured S-parameters $[S]_{12}^P$, for the first port pair thru$_{12}$ standard 301 in the test fixture 300. A second error adaptor 320, defined by parameters t2, m2, and d2, is connected between Port-2 and the model portion 312 in the port-pair model 300a.

Figure 6C:
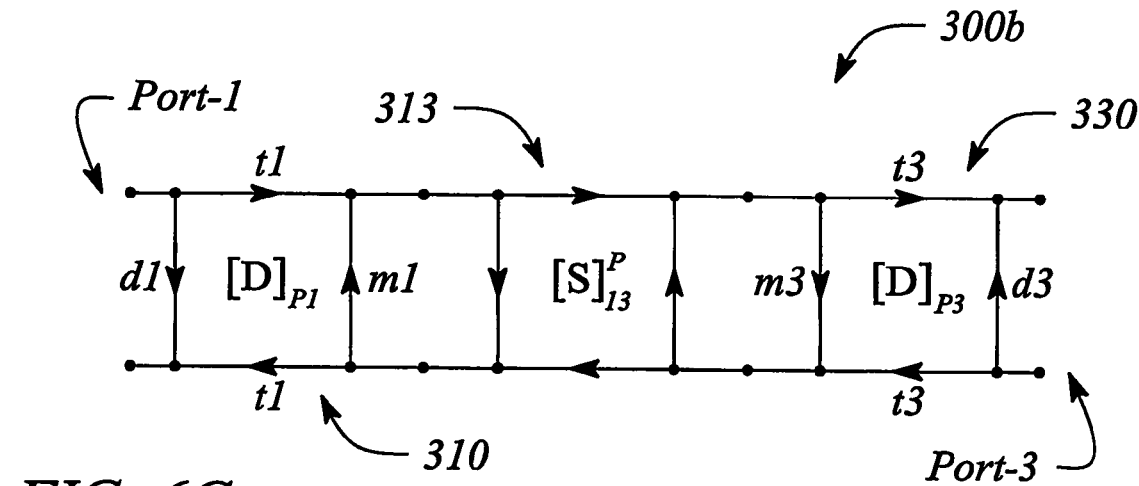
FIG. 6C illustrates a signal flow diagram of an embodiment of a model constructed for a second port pair of an exemplary 3-port production test fixture with a second thru standard mounted therein according to an embodiment of the present invention.

FIG. 6C illustrates a signal flow diagram of an embodiment of a port-pair model 300b constructed 114a' for the second port pair (i.e., Port-1/Port-3) of the exemplary 3-port production test fixture 300 with a second thru$_{13}$ standard mounted therein, according to an embodiment of the present invention. The port-pair model 300b illustrated in FIG. 6C includes the first error adaptor 310 defined by parameters t, m1, and d1 connected between Port-1 and a model portion 313 representing the measured S-parameters $[S]_{13}^P$ for the second thru$_{13}$ standard (not illustrated) in the test fixture 300. A third error adaptor 330, defined by parameters t3, m3, and d3, is connected between Port-3 and the model portion 313 in the port-pair model 300b.

Figure 6D:
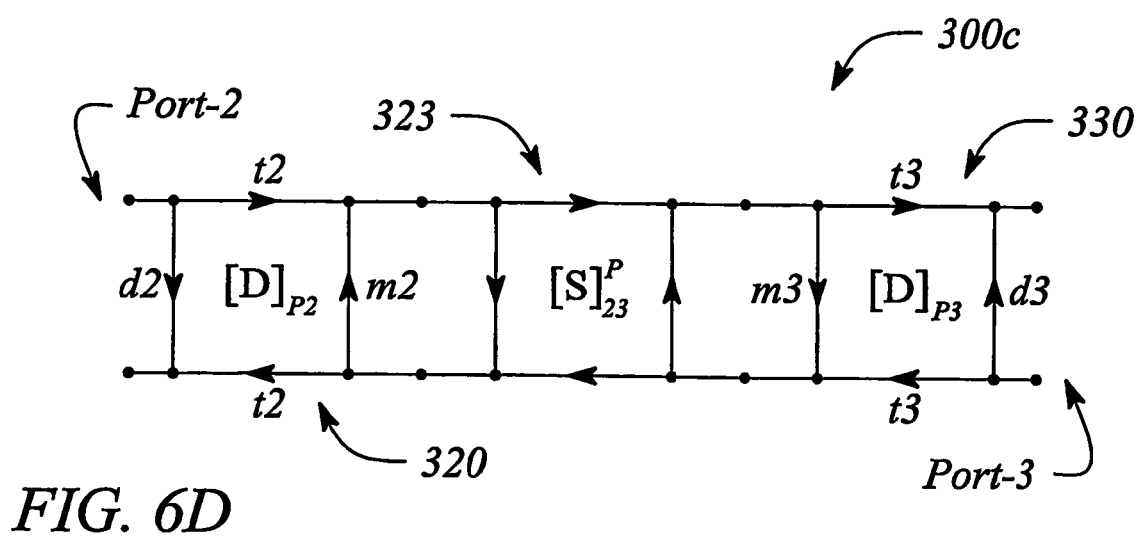
FIG. 6D illustrates a signal flow diagram of an embodiment of a model constructed for a third port pair of an exemplary 3-port production test fixture with a third thru standard mounted therein according to an embodiment of the present invention.

FIG. 6D illustrates a signal flow diagram of an embodiment of a port-pair model 300c constructed 114a' for the third port pair (i.e., Port-2/Port-3) of the exemplary 3-port production test fixture 300 with a third thru$_{23}$ standard mounted therein, according to an embodiment of the present invention. The port-pair model 300c illustrated in FIG. 6D includes the second error adaptor 320, defined by parameters 2, m2, and d2, connected between Port-2 and a model portion 323, representing the measured S-parameters $[S]_{23}^P$ for the third thru$_{23}$ standard (not illustrated) in the test fixture 300. The third error adaptor 330, defined by parameters t3, m3, and d3, is connected between Port-3 and the model portion 323 in the port-pair model 300c.

Each port-pair model 300a, 300b, 300c converts a respective one of the measured S-parameters $[S]_{12}^P$, $[S]_{13}^P$, $[S]_{23}^P$ into a corresponding converted measured S-parameter $[S]_{12}^{\hat{P}}$, $[S]_{13}^{\hat{P}}$, $[S]_{23}^{\hat{P}}$. The conversions depend on specific values of appropriate one of the parameters t1, t2, t3, m1, m2, m3, d1, d2 and d3 of respective error adaptors 310, 320, 330, as defined by a given model 300a, 300b, 300c.

Referring again to FIG. 5, solving 114' for elements of the difference array using the results of measuring 112' further comprises optimizing 114b' the port-pair models 300a, 300b, 300c, such that the converted measured S-parameters $[S]_{12}^{\hat{P}}$, $[S]_{13}^{\hat{P}}$, $[S]_{23}^{\hat{P}}$ approximate the measured S-parameters $[S]_{12}^R$, $[S]_{13}^R$, $[S]_{23}^R$ for the reference test fixture (not illustrated). In particular, the error adaptor parameters t1, t2, t3, m1, m2, m3, d1, d2 and d3 are adjusted by optimizing 114b' in an attempt to reduce a difference between the converted measured S-parameters $[S]_{12}^{\hat{P}}$, $[S]_{13}^{\hat{P}}$, $[S]_{23}^{\hat{P}}$ and the reference test fixture measured S-parameters $[S]_{12}^R$, $[S]R_{13}^R$, $[S]_{23}^R$. Optimizing 114b' is performed on all port-pair models essentially simultaneously.

In some embodiments, a metric such as, but not limited to, a difference and a mean square difference between respective elements or data points of the converted measured S-parameters $[S]_{12}^{\hat{P}}$, $[S]_{13}^{\hat{P}}$, $[S]_{23}^{\hat{P}}$ and the reference test fixture measured S-parameters $[S]R_{12}^R$, $[S]_{13}^R$, $[S]_{23}^R$ are chosen. For example, the metric may be computed comprising subtracting, element by element, the converted S-parameters $[S]_{12}^{\hat{P}}$ from the measured the S-parameters $[S]R_{12}^{R}$, subtracting, element by element, the converted S-parameters $[S]_{13}^{\hat{P}}$ from the measured S-parameters $[S]_{13}^{R}{}_{3}$, and subtracting, element by element, the converted S-parameters $[S]_{23}^{\hat{P}}$ from of the measured S-parameters $[S]_{23}^{R}$. Computing the metric further comprises computing a sum of the subtraction results to yield the metric.

Optimizing 114b' then proceeds by adjusting the error adaptor parameters t1, t2, t3, m1, m2, m3, d1, d2 and d3 in the port-pair models 300a, 300b, 300c with a goal of minimizing the metric. When the metric is sufficiently minimized with respect to an optimization goal, the error adaptor parameters t1, m2, t3, m1, m2, m3, d1, d2 and d3 are considered determined 110' in accordance with the method 100. In general, the optimization goal that defines the sufficient minimization of the metric must be determined on a case-by-case basis. However, one skilled in the art may readily determine the goal for a given optimization and metric without undue experimentation.

Essentially any optimization method and any modeling environment that is applied to the problem at hand may be employed in determining 110'. For example, the Agilent/EEs of Advanced Design System (ADS), manufactured by Agilent Technologies, Inc., Palo Alto, Calif., may be employed. One skilled in the art is familiar with a wide variety of optimization methods and modeling environments that can be used to implement determining 110' according to the present invention.

In some embodiments, additional standards, instead of or in addition to the aforementioned thru standards, may be used in determining 110', as noted hereinabove. For example, in addition to the three thru standards, a short and an open may also be measured 112' and included in solving 114' using additional port-pair models. In some instances, adding additional standards improves a convergence of the optimization 114b' used in determining 110'. Employing additional standards may also improve the results of determining 110' in the presence of noise in the measurements. A metric minimization, representing about a −35 dB correlation between S-parameter elements, has been shown to be generally achievable even in the presence of moderate noise. Such a correlation is consistent with connection repeatability in typical test fixtures.

Optimizing 114b' may be performed at a number of frequencies within the frequency range of interest. For example, optimizing 114b' may include three frequency points within the frequency range. The metric generally, although not always, includes the frequency dependence implied by performing the optimization 114b' at several frequencies.

In some embodiments, computer models of one or both of the test fixtures and the calibrations standards may be employed, wherein the models are based on mathematical representations of physical elements. Generally, the models may include elements representing discrete components such as resistors, capacitors, and inductors as well as elements representing distributed structures, such as models of transmission lines. Such models may be employed either instead of or in addition to the aforementioned port-pair models 300a, 300b, 300c.

While any reasonable model may be used, generally such models are comprised of elements based as much as possible on known physical characteristics of the test fixture and the calibration standards. For example, if the test fixture comprises a length of transmission line, the model of the test fixture may have an element corresponding to a length of transmission line. However, as an alternative, models that are simply mathematical formulas having adjustable coefficients may be used instead of models based on representations of physical elements. One skilled in the art is familiar with the equivalence between computer models based on mathematical formula and computer models employing mathematical representations of elements.

Figure 7:
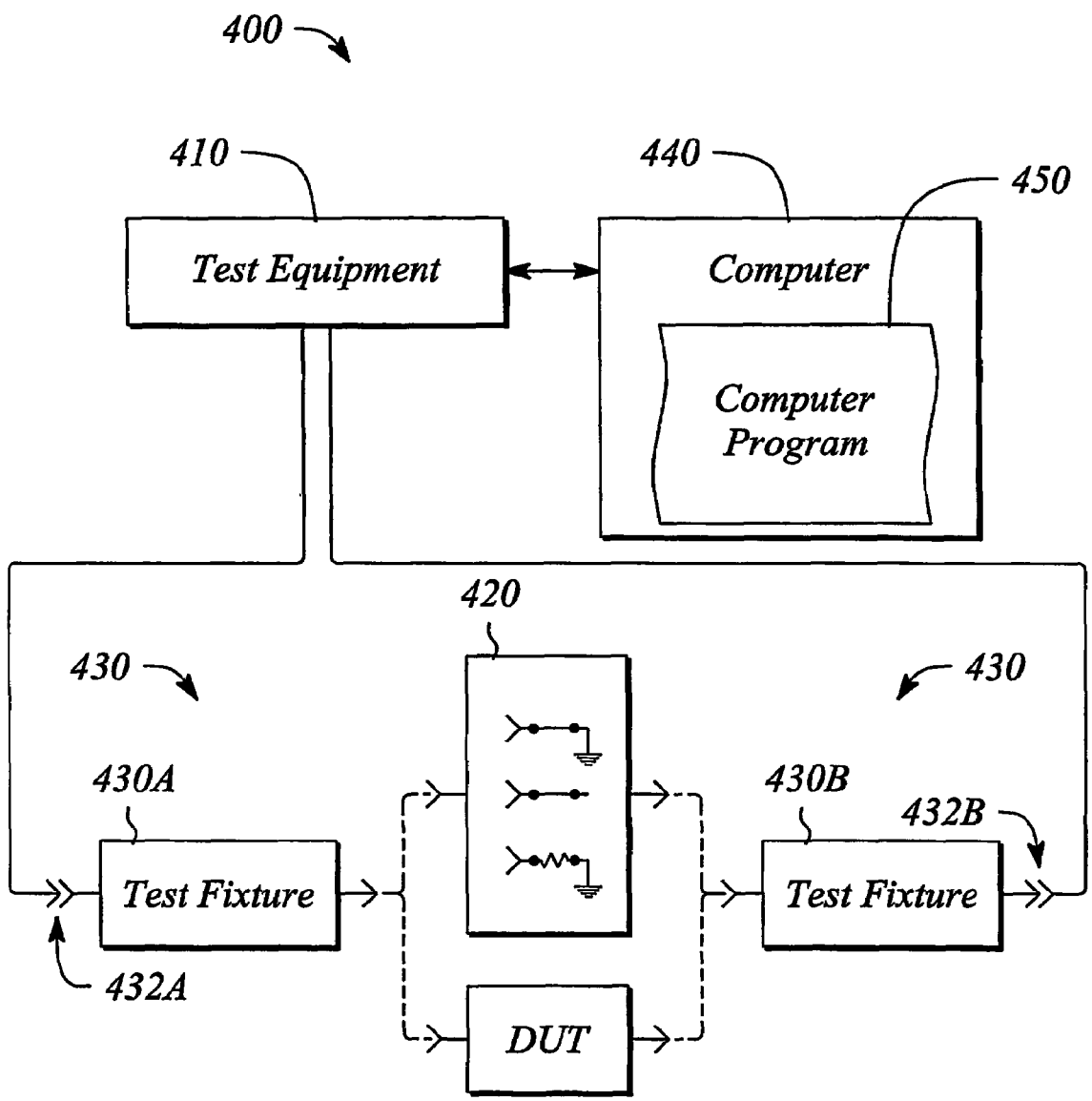
FIG. 7 illustrates a block diagram of a test system according to an embodiment of the present invention.

FIG. 7 illustrates a block diagram of a test system 400 according to an embodiment of the present invention. The test system 400 comprises a set 420 of calibration standards, which may include a short, an open, and a load, by way of example, as illustrated in FIG. 7 and/or several thru standards (not illustrated).

The test system 400 comprises test equipment 410 and a test fixture 430 adapted for a device under test (DUT). The test fixture 430 provides an interface between the test equipment 410 and the DUT. The test fixture 430 comprises an input portion 430A and an output portion 430B. Some test fixtures 430 may have only one of an input portion 430A and an output portion 430B, depending on the particular DUT and on the test equipment. Other test fixtures (not illustrated) may have one or more additional input portions and one or more additional output portions (e.g., 3-port test fixture). The test fixture 430 is representative of either a first or reference test fixture or a second or production test fixture.

The test system 400 further comprises a computer 440 or an equivalent processor/controller apparatus 440 (hereinafter 'computer', without limitation). The computer 440 may comprise a stand-alone general-purpose processor or may be a specialized processor built into the test equipment 410. The computer 440 receives data from the test equipment 410 and processes the data. In addition, the computer 440 provides a modeling environment for creating models and performing model optimization if desired. The test equipment 410 may be attached to the test fixture 430 at one or more test equipment ports 432A, 432B of the input and output portions 430A, 430B of the test fixture 430.

The test system 400 further comprises a computer program 450 executed by the computer 440. In some embodiments, the computer program 450 comprises instructions that implement transforming measurements of the DUT being tested by the test system 400. In particular, the instructions implement determining a port-specific difference array, wherein the difference array describes a difference between the first or reference test fixture and the second or production test fixture, the test fixtures 430 each being adapted for testing the DUT. The computer program 450 further comprises instructions that implement measuring a performance of the DUT, when the DUT is mounted in the second test fixture. The computer program 450 further comprises instructions that implement applying the difference array to the measured performance of the DUT, such that the DUT performance is adjusted to approximate a DUT performance with the DUT mounted in the first test fixture. In some embodiments, the computer program 450 comprises instructions that implement various embodiments of the method 100 of transforming measurements of the DUT, as described above. In some embodiments, the computer program 450 comprises instructions that implement various embodiments of methods 500 and/or 600 described hereinbelow.

Figure 8:
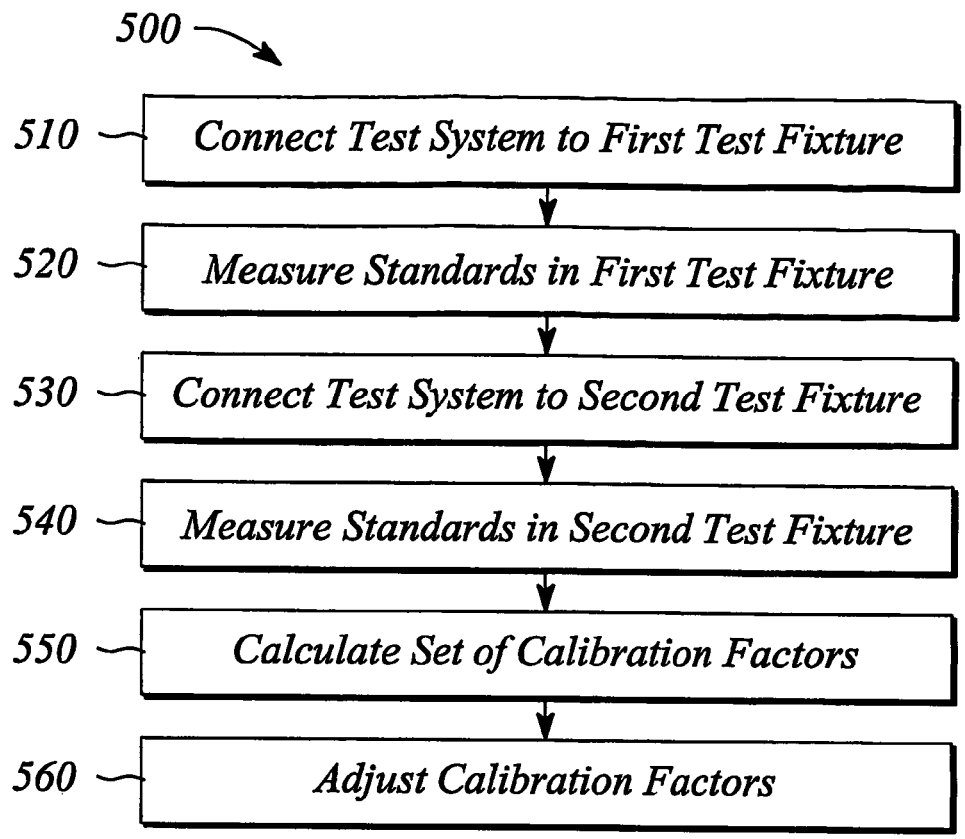
FIG. 8 illustrates a flow chart of a method of calibrating a test system for more than one test fixture according to an embodiment of the present invention.

In some embodiments of the present invention, a method of calibrating a test system for more than one test fixture is provided. In particular, according to some embodiments, the method of calibrating adjusts or adapts a calibration of the test system such that measurements taken for a device under test (DUT) in a second test fixture correspond with or approximate measurements for the DUT in a first test fixture. FIG. 8 illustrates a flow chart of a method 500 of calibrating a test system for more than one test fixture according to an embodiment of the present invention.

The method 500 of calibrating a test system comprises connecting 510 the test system to a first test fixture and measuring 520 parameters of the first test fixture according to a calibration standard. The method. 500 further comprises connecting 520 the test system to a second test fixture and measuring 540 parameters of the second test fixture according to the calibration standard. The method 500 further comprises calculating 550 a set of calibration factors and adjusting 560 the calibration factors, such that a measurement of the DUT yields approximately the same result regardless of which test fixture is utilized in the DUT measurement. These method steps may be repeated for each corresponding port of each test fixture. Moreover, the method steps may be repeated for additional test fixtures of a plurality of different test fixtures.

In some embodiments, measuring 520, 540 may employ either measuring 112 or measuring 112', described above with reference to FIGS. 4 and 5 for determining a difference array 110, 110', respectively. Moreover, the set of calibration factors may be calculated 550 comprising using conventional methods and either solving 114 or solving 114', also as described above for determining 110, 110', respectively. Adjusting 560 may employ applying 130 of any of the embodiments described above for the method 100 of transforming. Alternatively, adjusting 560 comprises applying the calibration factors to a calibration of the test system using differences between the measured parameters for corresponding ports of each test fixture to provide a port-specific calibration of the test system. The calibration factors correct calibration coefficients of the test system.

Figure 9:
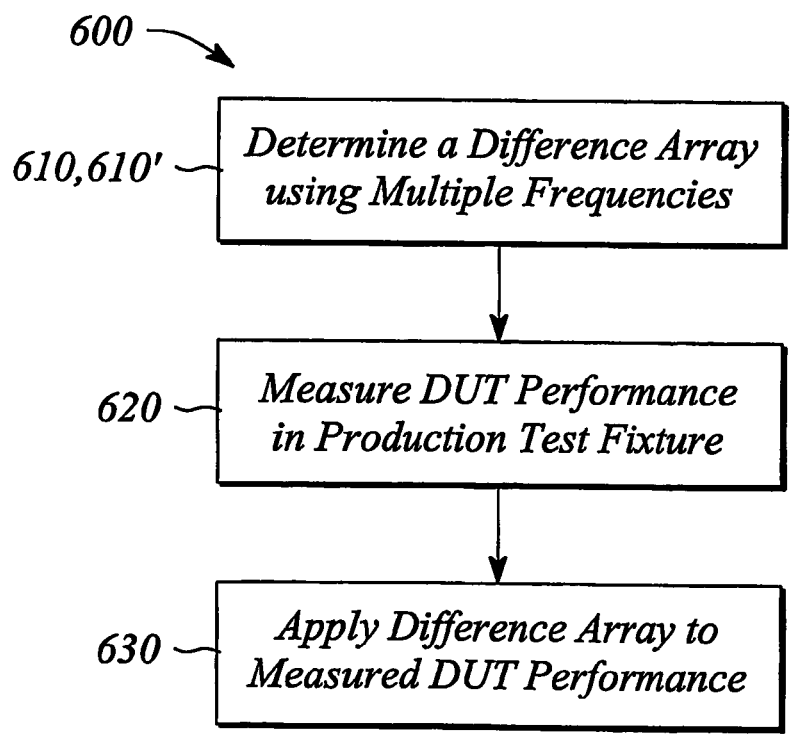
FIG. 9 illustrates a flow chart of a method of matching measurements of a device under test (DUT) in a second test fixture to hypothetical measurements of the DUT in a first test fixture according to an embodiment of the present invention.

FIG. 9 illustrates a flow chart of a method 600 of matching measurements of a device under test (DUT) in a second test fixture to hypothetical measurements of the DUT in a first test fixture according to an embodiment of the present invention. The method 600 of matching comprises determining 610, 610' a port-specific difference array. The difference array describes a difference between a first test fixture and a second test fixture at a corresponding test port of the test fixtures. An element of the difference array is determined using measurements of a set of calibration standards in the first and second test fixtures. The calibration standard measurements are performed at plurality of frequencies with a test system.

The method 600 of matching measurements further comprises measuring 620a performance of the DUT using the test system, wherein the DUT is mounted in the second test fixture. The method 600 further comprises applying 630 the port-specific difference array to measurements of the DUT obtained during measuring 620 to transform the measurements into measurements that match the hypothetical measurements of the DUT in the first test fixture.

In some embodiments, determining 610 the port-specific difference array comprises measuring characteristics of the set of calibration standards at corresponding ports of the first test fixture and the second test fixture at the plurality of frequencies. Measuring characteristics may be essentially similar to measuring 112, 112', described hereinabove with respect to determining 110, 110' of the method 100 of transforming measurements. In particular, a set of standards including one or more of an open, a short, a load, and a thru is inserted into each test fixture and parameters of the standard in combination with the test fixture are measured at a plurality of frequencies.

Determining 610 further comprises solving for terms of an error adaptor using results obtained from measuring characteristics of the calibration standard set for each test fixture at the plurality of frequencies. Solving for terms of the error adaptor may be essentially similar to solving 114, 114' described hereinabove with respect to determining 110, 110' of the method 100 of transforming measurements.

In some embodiments, during determining 610, the element is determined by computing a complex square root of a term of a port-specific error adaptor determined from the measured characteristics of the set of standards for both test fixtures. The complex square root is computed using a plurality of values of the error adaptor term that corresponds to the plurality of frequencies. In other embodiments, during determining 610', the element is determined by optimizing a model across the plurality of frequencies using the measured characteristics of the set of standards for both test fixtures. In particular, determining the element by optimizing is similar to solving 114' described hereinabove with respect to determining 110' of the method 100 of transforming measurements. For example, to implement determining 610', solving 114' may be performed using the measured characteristics of the set of standards for both test fixtures at more than one frequency.

In determining 610, when the complex square root of the term of the port-specific error adaptor is computed, the element of the difference array is produced. For example, the error adaptor term may be a complex product of two elements of the difference array (e.g., $Er = D_{21} \cdot D_{12}$). The error adaptor term is represented by data derived from the measured characteristics of the set of standards in each of the test fixtures at each frequency of the plurality of frequencies. As such, the error adaptor term data is a sequence of data points, where each data point has a phase and a magnitude.

In some embodiments, computing comprises unwrapping a phase portion of the error adaptor term data, wherein the unwrapping removes phase transitions from the phase portion. Unwrapping comprises examining the data points within the error adaptor term data as a function of frequency and determining if a phase change of more than 180 degrees occurs between adjacent data points (i.e., a phase wrap). Unwrapping further comprises subtracting 360 degrees from each data point of the error adaptor term data following a phase wrap. Generally, unwrapping is performed for all the data points.

In some embodiments, computing further comprises estimating a group delay of the error adaptor term from the phase-unwrapped data points. Estimating the group delay comprises selecting a pair of the data points. For example, two of the data points having a predetermined phase difference may be selected and used as the pair. Estimating further comprises computing from the data point pair a group delay estimate. For example, the group delay estimate may be computed as a ratio of a phase difference over a frequency difference for the pair of data points. In general, any method including any conventional group delay calculation method known in the art may be employed in estimating the group delay.

Computing further comprising removing from the phase-unwrapped data points a number of complete phase wraps associated with a phase of a first data point. The first data point is the data point having a frequency nearest to direct current (DC) or zero Hz (i.e., the error adaptor term data point at a low end of the frequency range). The number of complete phase wraps of the first data point phase is determined by computing a phase shift between DC and the first data point phase. A phase shift of the first data point is then computed by multiplying the estimated group delay and a frequency of the first data point. The result of multiplying is expressed as phase in degrees.

A complete phase wrap is a phase wrap of 360 degrees. Thus, the number of complete phase wraps is determined from the result of multiplying by dividing the result by 360 and then truncating to a whole number. As such, removing comprises multiplying the resulting whole number by 360 degrees and subtracting the product from the unwrapped phase of each of the data points to yield wrap-normalized data points.

Computing further comprises dividing a phase of each of the wrap-normalized data points by two to produce a phase portion of the complex square root. Determining 610 further comprises taking a positive, real-valued square root of the magnitude of each data point to produce a magnitude portion of the square root.

Thus, there has been described various embodiments of the present invention that facilitate measuring a DUT in more than one test fixture. It should be understood that the above-described embodiments are merely illustrative of some of the many specific embodiments that represent the principles of the present invention. Those skilled in the art can readily devise numerous other arrangements without departing from the scope of the present invention.

What is claimed is:

1. A method of transforming measurements of a device under test (DUT) produced by a test system, the method comprising:

determining a port-specific difference array, the difference array describing a difference between a first test fixture and a second test fixture at a corresponding test port of the test fixtures;

measuring a performance of the DUT using the test system, wherein the DUT is mounted in the second test fixture; and applying the port-specific difference array, such that the measured DUT performance approximates a hypothetical DUT performance for the DUT mounted in the first test fixture and measured with the test system.

2. The method of transforming measurements of claim 1, wherein the determined port-specific difference array is an error adaptor that is applied to the measured performance of the DUT to essentially remove an effect of a port portion of the second test fixture and to add an effect of a corresponding port portion of the first test fixture on the measured performance.

3. The method of transforming measurements of claim 1, wherein determining a port-specific difference array comprises:

measuring characteristics of a set of calibration standards at corresponding ports of the first test fixture and the second test fixture by separately inserting each calibration standards of the set in each test fixture at a respective port; and solving for elements of the difference array using results obtained from measuring characteristics of the calibration standard set for each test fixture.

4. The method of transforming measurements of claim 3, wherein the calibration standards of the set connect corresponding pairs of ports to one another for each test fixture, such that all combinations of ports in each test fixture are separately connected as pairs for measuring the characteristics.

5. The method of transforming measurements of claim 3, wherein measuring comprises:

measuring a reflection parameter of each standard of the set of calibration standards separately for each port of the first test fixture; and measuring a reflection parameter of each standard of the set of calibration standards separately for each corresponding port of the second test fixture, wherein one or more of the standards of the set isolate the respective port from other ports of the respective test fixture.

6. The method of transforming measurements of claim 3, wherein measuring comprises:

measuring S-parameters for each standard of the set of calibration standards separately for each port pair of the first test fixture; and measuring S-parameters for each standard of the set of calibration standards separately for each corresponding port pair of the second test fixture, wherein the standards of the set are thru standards that connect pairs of ports together to form the port pairs.

7. The method of transforming measurements of claim 3, wherein solving for elements comprises:

solving several equations for several unknowns using the measured results, the solved unknowns representing the difference array elements.

8. The method of transforming measurements of claim 3, wherein solving for elements comprises:

optimizing a model using the measured results for each test fixture, the model representing one or more of the port-specific difference arrays, wherein optimizing comprises adjusting parameters of the model until a difference between test fixture measurements is minimized, the test fixture measurements being converted measurements of the second test fixture produced by the model using the measured results for the second test fixture and the measured results for the first test fixture, the model parameters representing the elements of the difference array.

9. The method of transforming measurements of claim 3, wherein measuring and solving are repeated for each port or each pair of ports of each of the test fixtures.

10. The method of transforming measurements of claim 3, wherein solving for elements of the difference array comprises determining a complex square root of one of the elements, wherein the square root is determined using data representing the element at more than one frequency.

11. The method of transforming measurements of claim 1, wherein applying the difference array to the measured performance of the DUT directly transforms the measured DUT performance into the approximation of the hypothetical performance.

12. The method of transforming measurements of claim 1, wherein applying the difference array modifies a calibration of a test system, such that the measured performance of the DUT produced using the test system is the hypothetical measured performance.

13. The method of transforming measurements of claim 1, wherein a performance of one or both of the first test fixture and the second test fixture and a performance of one or more calibration standards of the set used in determining the port-specific difference array are unknown or poorly known.

14. The method of transforming measurements of claim 1, wherein determining employs measurements of the test fixtures at a plurality of frequencies in a frequency range of interest for the DUT.

15. A method of calibrating a test system for more than one test fixture, the method comprising:

measuring parameters of a first test fixture having a calibration standard mounted in the first test fixture, measuring being performed using the test system connected to the first test fixture;

measuring parameters of a second test fixture having the calibration standard similarly mounted in the second test fixture, measuring being performed using the test system connected to the second test fixture; and adjusting a calibration of the test system using differences between the measured parameters for corresponding ports of each test fixture, wherein the adjusted calibration is a port-specific calibration of the test system such that measurements taken with the test system for a device under test (DUT) in either test fixture approximate each other.

16. The method of calibrating of claim 15, wherein measuring parameters of the first test fixture and the second test fixture comprises:

mounting a calibration standard to connect between a corresponding pair of ports of each test fixture; and measuring parameters for each corresponding pair of ports of the test fixtures using a set of calibration standards, a different standard connecting a different corresponding pair of ports for each measurement, wherein at least one of the calibration standards of the set is a thru standard.

17. The method of calibrating of claim 15, wherein adjusting comprises:

determining a port-specific difference array for each port of the second test fixture from results of measuring parameters, the port-specific difference array representing an error adaptor that transforms the measurements of the DUT in the second test fixture into measurements of the DUT as if measured with the first test fixture.

18. The method of calibrating of claim 17, wherein determining comprises:

constructing a port-pair model of the second test fixture with a specific error adaptor attached to each port of a pair of ports and a thru calibration standard mounted in the second test fixture connecting the pair of ports, such that a separate model is constructed for each pair of ports of the second test fixture, each port-pair model converting a respective measured parameter into a corresponding converted measured parameter of the second test fixture; and optimizing the port-pair model for each pair of ports of the second test fixture such that the converted measured parameters approximate the measured parameters of the first test fixture.

19. The method of calibrating of claim 18, wherein optimizing attempts to reduce a difference between the converted measured parameters of the second test fixture and the measured parameters of the first test fixture, such that when an optimization goal is reached, the error adaptors of the port-specific difference arrays are considered determined.

20. The method of calibrating of claim 15, wherein measuring parameters comprises measuring at a plurality of frequency points in a frequency range of interest for the DUT.

21. A test system that measures a device under test (DUT) using different test fixtures comprising:

test equipment;

a test fixture that interfaces the DUT to the test equipment;

a computer connected to receive and process data from the test equipment; and a computer program executed by the computer, the computer program comprising instructions that, when executed by the computer, implement determining a port-specific difference array that adjusts for a difference between a first test fixture and a second test fixture when each is used to interface the DUT for measurements at a corresponding test port.

22. The test system of claim 21, wherein the computer program further comprises instructions that implement measuring a performance of the DUT when the DUT is connected to the test equipment using the second test fixture; and instructions that implement applying the difference array to correct or adjust the measured performance of the DUT, such that the DUT performance measured using the second test fixture approximates a hypothetical DUT performance as if measured using the first test fixture to interface the DUT to the test equipment.

23. The test system of claim 22, wherein the instructions that implement applying comprise applying the difference array directly to the measured performance of the DUT produced by the test system to transform the measured DUT performance into the hypothetical DUT performance.

24. The test system of claim 22, wherein the instructions that implement applying comprise applying the difference array to a calibration of the test equipment to correct calibration coefficients of the test equipment, such that the measured performance of the DUT is equivalent to the hypothetical DUT performance.

25. The test system of claim 21, wherein the computer program further comprises instructions that implement determining a complex square root of an element of the difference array using values of the element at a plurality of frequencies.

26. A method of matching measurements of a device under test (DUT) in a second test fixture to hypothetical measurements of the DUT in a first test fixture using a test system, the method comprising:

determining a port-specific difference array, the difference array describing a difference between the first test fixture and the second test fixture at a corresponding test port of the test fixtures, wherein an element of the difference array is determined using measurements of a set of calibration standards in the test fixtures, the measurements being performed at a plurality of frequencies with the test system.

27. The method of matching measurements of claim 26, further comprising:

measuring a performance of the DUT using the test system, wherein the DUT is mounted in the second test fixture; and applying the port-specific difference array to measurements of the DUT mounted in the second test fixture to transform the measurements into measurements that match the hypothetical measurements of the DUT in the first test fixture.

28. The method of matching measurements of claim 26, wherein the element is determined by optimizing a model across the plurality of frequencies using the calibration standard measurements.

29. The method of matching measurements of claim 26, wherein the element is determined from a complex square root of a term of a port-specific error adaptor determined from the calibration standard measurements, the complex square root being computed using a plurality of values of the error adaptor term that corresponds to the plurality of frequencies.

30. The method of matching measurements of claim 29, wherein computing the complex square root comprises:

unwrapping a phase portion of data points representing the element at different frequencies to produce phase-unwrapped data points;

dividing a wrap-normalized phase of the data points by two to yield a phase portion of the square root; and computing a positive real-valued square root of magnitudes of the data points to produce a magnitude portion of the square root.

31. The method of matching measurements of claim 30, further comprising before dividing a wrap-normalized phase:
  estimating a group delay of the phase-unwrapped data points;
  removing from the phase portion of the phase-unwrapped data points a number of complete phase wraps associated with a first data point to produce data points having the wrap-normalized phase, the number of complete phase wraps being computed using the estimated group delay.

* * * * *